US012587136B1

(12) United States Patent

Lin

(10) Patent No.: US 12,587,136 B1

(45) Date of Patent: Mar. 24, 2026

(54) LOW-NOISE CRYSTAL OSCILLATOR USING GAIN BOOSTING AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 19/004,539

(22) Filed: Dec. 30, 2024

(51) Int. Cl.
H03B 5/36 (2006.01)

(52) U.S. Cl.
CPC ..... H03B 5/364 (2013.01); *H03B 2200/0088* (2013.01)

(58) Field of Classification Search
CPC ... H03B 5/364; H03B 5/24; H03B 2200/0088
See application file for complete search history.

(56) References Cited

U.S. PATENT DOCUMENTS

| 10,666,197 B1 * | 5/2020 | Lin | ......................... | H03B 5/364 |
| 2020/0021245 A1 * | 1/2020 | Jang | ....................... | H03B 5/364 |

* cited by examiner

*Primary Examiner* — Jeffrey M Shin

(74) *Attorney, Agent, or Firm* — McClure, Qualey & Rodack, LLP

(57) ABSTRACT

A crystal oscillator includes a first PMOS (p-channel metal-oxide semiconductor) transistor having its gate, source, and drain terminals connected to a gate node, a source node, and a drain node, respectively; a DC (direct current) coupling network configured to couple the gate node to a first bias node; a NMOS (n-channel metal-oxide semiconductor) transistor having its gate, source, and drain terminals connected to a second bias node, a ground node, and the drain node, respectively; a second PMOS transistor having its gate, source, and drain terminals connected to the drain node, a power supply node, and the source node, respectively; a feedback capacitor positioned between the source node and the gate node; a shunt capacitor positioned between the source node and one of the power supply node and the ground node; and a crystal positioned between the gate node and one of the ground node and the power supply node.

15 Claims, 3 Drawing Sheets

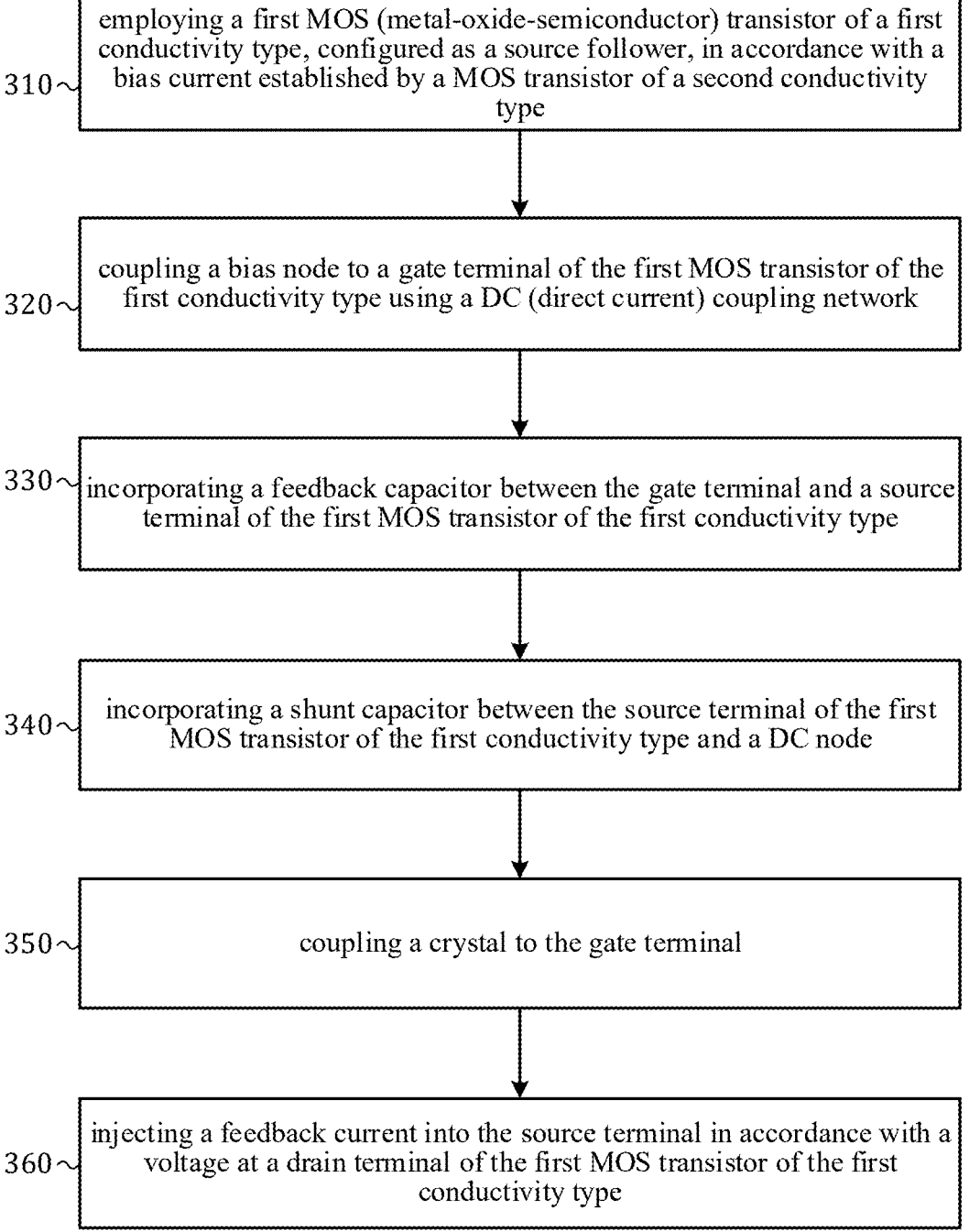

310～ employing a first MOS (metal-oxide-semiconductor) transistor of a first conductivity type, configured as a source follower, in accordance with a bias current established by a MOS transistor of a second conductivity type 320～ coupling a bias node to a gate terminal of the first MOS transistor of the first conductivity type using a DC (direct current) coupling network 330～ incorporating a feedback capacitor between the gate terminal and a source terminal of the first MOS transistor of the first conductivity type 340～ incorporating a shunt capacitor between the source terminal of the first MOS transistor of the first conductivity type and a DC node 350～ coupling a crystal to the gate terminal 360～ injecting a feedback current into the source terminal in accordance with a voltage at a drain terminal of the first MOS transistor of the first conductivity type

FIG. 3

LOW-NOISE CRYSTAL OSCILLATOR USING GAIN BOOSTING AND METHOD THEREOF

BACKGROUND OF THE DISCLOSURE

Field of the Disclosure

The present disclosure generally relates to crystal oscillators, and more particularly to crystal oscillators that utilizes gain boosting.

Description of Related Art

In the present disclosure, a signal is defined as a voltage of a variable level that carries specific information and may vary over time. The level of the signal at any given moment indicates its state at that moment. A logical signal is characterized by two states: a low state and a high state; the logical signal is deemed high when its voltage level exceeds a predetermined trip point and low otherwise. In reference to a logical signal Q, the phrase "Q is high" or "Q is low" implies "Q is in the high state" or "Q is in the low state," respectively. It is noted that the trip point of a first logical signal may differ from that of a second logical signal.

A clock signal, herein referred to as a "clock," is defined as a logical signal that cyclically transitions between a low state and a high state. A clean clock signal is characterized by consistent periodicity in the transitions between the low state and the high state, while noise in the clock signal disrupts this periodicity.

Crystal oscillators that can generate a clean clock signal with very low noise are highly desirable. FIG. 1 illustrates a schematic diagram of a prior art crystal oscillator 100, as disclosed by Lin in U.S. Pat. No. 10,666,197, comprising a crystal 120, a PMOS (p-channel metal-oxide semiconductor) transistor 111, a NMOS (n-channel metal-oxide semiconductor) transistor 112, three capacitors 141, 142, and 143, and two resistors 131 and 132. The crystal 120 determines the oscillation frequency of the oscillation signal VOSC, which is a clean and periodic signal that can be used as a clock. Capacitor 142 provides strong AC (alternate current) between the gates of NMOS transistor 112 and PMOS transistor 111, which, along with capacitors 141 and 143, establish a negative resistance presented to the oscillation signal VOSC to sustain the oscillation. Resistors 131 and 132 provide DC coupling from a first bias node VB131 and a second bias node VB132 to the gates of PMOS transistor 111 and NMOS transistor 112, respectively, to establish a proper biasing condition. The crystal oscillator 100 can generate a low-noise clock primarily due to the PMOS transistor 111 and NMOS transistor 112 jointly and coherently function as a regenerative circuit, thus proving superior to prior art that employs only a single PMOS transistor or NMOS transistor for this purpose as a gain is effectively enhanced by a factor of two. However, the crystal oscillator 100 has a drawback in that the two resistors 131 and 132 become significant noise contributors, potentially introducing noise to the oscillation signal VOSC.

What is desired is a crystal oscillator that can provide a higher gain for the regeneration function.

BRIEF DESCRIPTION OF THIS DISCLOSURE

An objective of this present invention is to use a regenerative network with gain boosting to establish an oscillation.

Another objective of this present invention is to use a regenerative network with gain boosting to establish an oscillation while reducing a noise of a biasing network using a self-timed intermittent DC (direct current) coupling.

In one embodiment, a crystal oscillator comprises: a first PMOS (p-channel metal-oxide semiconductor) transistor having its gate, source, and drain terminals connected to a gate node, a source node, and a drain node, respectively; a DC (direct current) coupling network configured to couple the gate node to a first bias node; a NMOS (n-channel metal-oxide semiconductor) transistor having its gate, source, and drain terminals connected to a second bias node, the ground node, and the drain node, respectively; a second PMOS transistor having its gate, source, and drain terminals connected to the drain node, a power supply node, and the source node, respectively; a feedback capacitor positioned between the source node and the gate node; a shunt capacitor positioned between the source node and either the power supply node or ground node; and a crystal positioned between the gate node and either the ground node or the power supply node.

In one embodiment, a method for generating an oscillation signal is provided. The method comprises: employing a first MOS (metal-oxide-semiconductor) transistor of a first conductivity type, configured as a source follower, in accordance with a bias current established by a MOS transistor of a second conductivity type; coupling a bias node to a gate terminal of the first MOS transistor of the first conductivity type using a DC (direct current) coupling network; incorporating a feedback capacitor between the gate terminal and a source terminal of the first MOS transistor of the first conductivity type; incorporating a shunt capacitor between the source terminal of the first MOS transistor of the first conductivity type and a DC node; coupling a crystal to the gate terminal; and injecting a feedback current into the source terminal in accordance with a voltage at a drain terminal of the first MOS transistor of the first conductivity type.

BRIEF DESCRIPTION OF THE DRAWINGS

FIG. 3 shows a flow diagram of a method of generating an oscillation signal in accordance with an embodiment of the present disclosure.

DETAILED DESCRIPTION OF THIS DISCLOSURE

Figure 1:
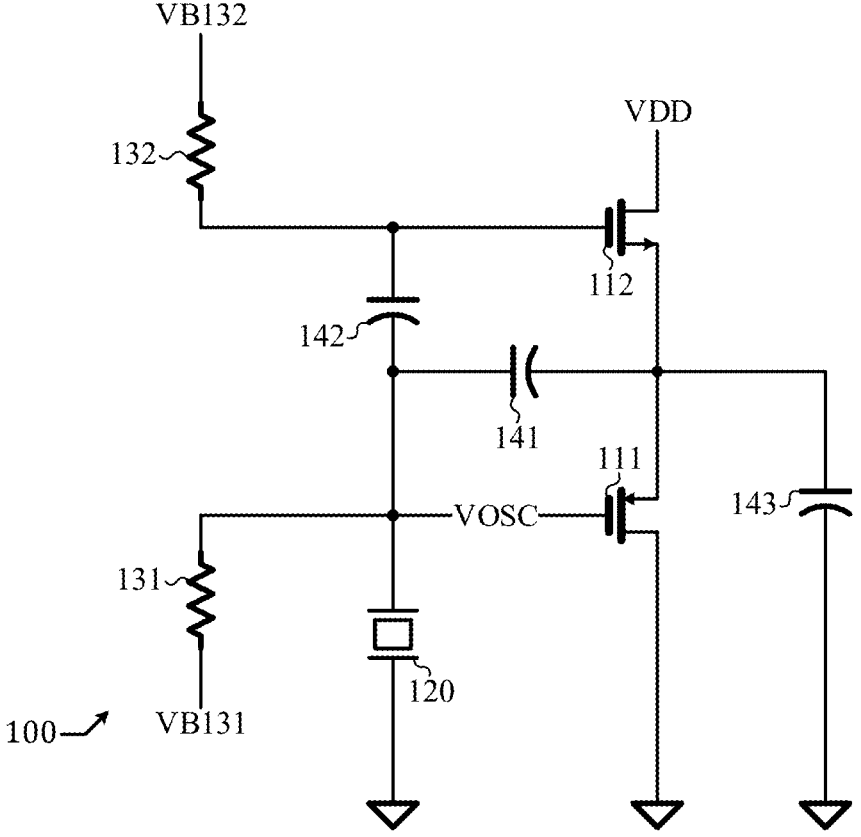
FIG. 1 shows a schematic diagram of a prior art crystal oscillator.

The present disclosure is directed to crystal oscillator. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons having ordinary skill in the art are familiar with terms and basic concepts related to microelectronics as used in this disclosure, such as "voltage," "signal," "logical signal," "clock," "source follower," "oscillator," "bias," "AC (alternating current)," "DC (direct current)" "power supply," "ground," "resistor," "capacitor," "impedance,' "CMOS (complementary metal-oxide semiconductor)," "NMOS (n-channel metal-oxide semiconductor) transistor," and "PMOS (p-channel metal-oxide semiconductor) transistor." These terms are used within the context of microelectronics, and the associated concepts are apparent to those skilled in the art, thereby obviating the need for a detailed explanation herein.

Those skilled in the art will recognize the symbol for a MOS (metal-oxide semiconductor) transistor and will be able to identify the "source," "gate," and "drain" terminals associated with both PMOS (p-channel metal-oxide semiconductor) and NMOS (n-channel metal-oxide semiconductor) transistors. For the sake of brevity, the terms "source terminal," "gate terminal," and "drain terminal" may be referred to as "source," "gate," and "drain," respectively, and it should be understood from the context without causing confusion. Those skilled in the art will understand circuit schematics comprising PMOS and/or NMOS transistors without needing a detailed description of the interconnections between components in such schematics.

A MOS transistor, whether PMOS or NMOS, is said to be configured in a diode-connected topology when its gate is electrically connected to its drain terminal.

A MOS transistor has a threshold voltage; when a gate-to-source voltage is smaller than the threshold voltage, the MOS transistor is non-conductive.

This present disclosure is described from an engineering standpoint. For example, with reference to two variables, X and Y, when it is stated that "X is equal to Y," it signifies that "X is approximately equal to Y," denoting that "a difference between X and Y is within a specified engineering tolerance." Similarly, when it is asserted that "X is zero," it implies that "X is approximately zero," meaning that "X is within a specified engineering tolerance." The expression "X is substantially smaller than Y" denotes that "X is negligible with respect to Y," indicating that "the ratio between X and Y is within a specified engineering tolerance, thereby rendering X negligible in comparison to Y."

A "power supply node" is herein defined as a circuit node possessing a voltage that is substantially equal to a power supply voltage, which is greater than zero but may exhibit minor high-frequency fluctuations. Conversely, a "ground node" is a circuit node maintaining a voltage that is substantially zero, albeit with potential minor high-frequency fluctuations. Throughout this disclosure, the term "VDD" represents a power supply node, whereas a ground symbol, which can be readily identified by those of ordinary skill in the art, shall denote a ground node. In this present disclosure, both the power supply node and the ground node are referred to as "DC nodes," as they provide substantially steady and stable DC voltages.

Figure 2:
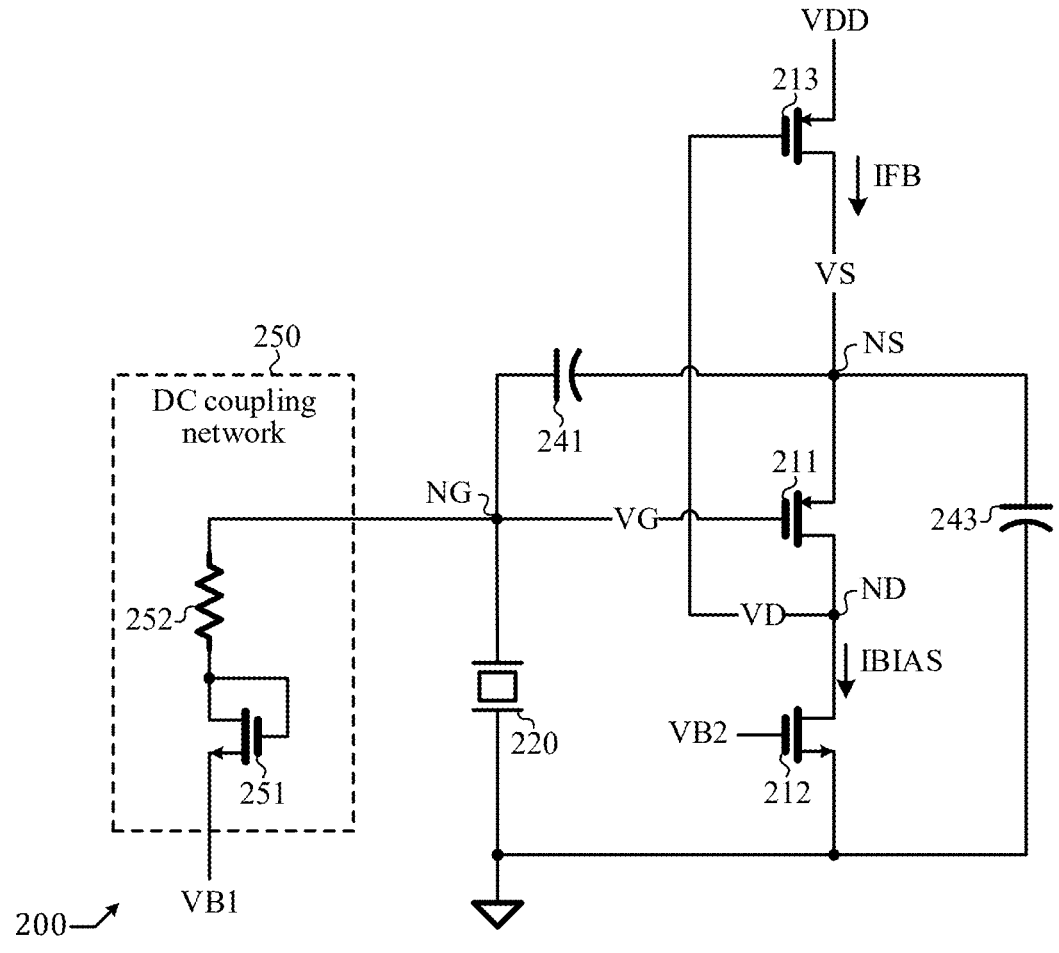
FIG. 2 shows a schematic diagram of a crystal oscillator in accordance with an embodiment of the present disclosure.

As illustrated in FIG. 2, a crystal oscillator 200, in accordance with an embodiment of the present invention, comprises: a crystal 220 positioned between a gate node NG and a ground node; a first PMOS transistor 211 having its gate, source, and drain terminals connected to the gate node NG, a source node NS, and a drain node ND, respectively; a DC (direct current) coupling network 250 configured to couple the gate node NG to a first bias node VB1; a NMOS transistor 212 having its gate, source, and drain terminals connected to a second bias node VB2, a ground node, and the drain node ND, respectively; a feedback capacitor 241 positioned between the gate node NG and the source node NS; a shunt capacitor 243 positioned between the source node NS and the ground node; and a second PMOS transistor 213 having its gate, source, and rain terminals connected to the drain node ND, a power supply node VDD, and the source node NS, respectively.

The first bias node VB1 is characterized by having low impedance, thereby providing a well-defined, stable, and steady DC bias voltage. In an embodiment, by way of example but not limitation, the first bias node VB1 is the ground node.

A gate voltage VG at the gate node NG is an oscillatory signal having a frequency approximately equal to the resonant frequency of the crystal 220. The first PMOS transistor 211 is configured as a source follower, and in conjunction with the feedback capacitor 241 and the shunt capacitor 243, forms a regenerative network presenting a negative resistance at the gate node NG, thereby sustaining the oscillation of VG. The NMOS transistor 212 is configured as a current source to establish a bias current IBIAS for the first PMOS transistor 211. The second PMOS transistor 213 provides a gain boosting function by outputting a feedback current IFB in accordance with a drain voltage VD at the drain node ND. When a source voltage VS at the source node NS rises (falls), the drain voltage VD rises (falls) accordingly, causing the second PMOS transistor 213 to decrease (increase) the feedback current IFB, thus lowering (raising) the source voltage VS. As a result, the second PMOS transistor 213 carries out a negative feedback function and effectively reduces an output resistance of the source follower embodied by the first PMOS transistor 211 by a gain boosting factor approximately equal to $1+g_{m213}(r_{o211}\|r_{o212})$, where $g_{m213}$ is the transconductance of the second PMOS transistor 213 that characterizes a ratio between an incremental change of the feedback current IFB and an incremental change of the drain voltage VD, $r_{o211}$ is the output resistance of the first PMOS transistor 211, $r_{o212}$ is the output resistance of the NMOS transistor 212, and "|" denotes a parallel connection. Note that the "$r_{o211}\|r_{o212}$" term is an effective resistance at the drain node ND and is equal to $r_{o211}r_{o212}/(r_{o211}+r_{o212})$, which is an equation of parallel connection well understood by those of ordinary skill in the art. The negative resistance of the regenerative network is increased by the gain boosting factor.

The prior art crystal oscillator 100 utilizes both NMOS transistor 112 and PMOS transistor 111 to embody the source follower, thereby effectively increasing the negative resistance by a factor approximately equal to two compared to using only the PMOS transistor 111. In contrast, the present invention's crystal oscillator 200 uses the feedback functional provided by the second PMOS transistor 213 and can increase the negative resistance by a factor higher than two. Therefore, the crystal oscillator 200 exhibits superiority over the prior art crystal oscillator 100 in this regard.

The DC coupling network 250 comprises a resistor 252 and a diode-connected NMOS transistor 251 having a source terminal connected to the first bias node VB1, a drain terminal coupled to the gate node NG via the resistor 252, and a gate terminal connected to the drain terminal. This particular implementation provides a low-noise advantage. The NMOS transistor 251 is substantially non-conductive when the gate voltage VG at the gate node NG is below a certain voltage level related to a threshold voltage of the NMOS transistor 251. For instance, if VB1 is the ground node and VG oscillates between –1V and 1V and the threshold voltage of NMOS transistor 251 is 0.6V, the diode-based DC coupling network 250 remains substantially non-conductive during the interval when VG is between –1V and 0.6V and exhibits a resistance approximately equal to the resistance of the resistor 252 when VG is between 0.6V and 1V. Thus, the noise contribution from DC coupling is significantly reduced compared to the prior art where simply a resistor is utilized.

In an alternative embodiment, the diode-connected NMOS transistor 251 is eliminated and replaced by a direct electrical connection, effectively creating a short circuit. Consequently, the resistor 252 is directly coupled to the first bias node VB1. Although this configuration maintains the gain boosting effect inherent to the crystal oscillator 200, it forfeits the noise reduction advantages provided by the diode-connected NMOS transistor 251.

Various modifications, adaptations, and alternative embodiments may be employed to replace the specific embodiments of the DC coupling networks 250 illustrated in FIG. 2. For example, the diode-connected NMOS transistor 251 may be substituted with a diode-connected PMOS transistor; the resistor 252 and the diode-connected NMOS transistor 251 may be interchanged in position, such that the source of NMOS transistor 251 connects to VB1 via the first resistor 252 and the drain of the NMOS transistor 251 directly connects to NG; the resistor 252 may be repositioned between the drain and the gate of NMOS transistor 251, while the gate of NMOS transistor 251 directly connects to NG; and others. Regardless of the specific configuration, two objectives must be satisfied to preserve the noise reduction advantages. First, the DC coupling must be provided such that, under static conditions, the bias voltages at the first bias nodes VB1 can be coupled to the gates of PMOS transistor 211, thereby establishing a bias condition. Second, under dynamic conditions when the crystal oscillator 200 is oscillating, the DC coupling networks must be effectively non-conductive during a significant portion of the oscillation period in accordance with a timing of the oscillation, thus minimizing noise contributions from the DC coupling. In summary, DC coupling for biasing is conducted in a self-timed intermittent manner that is synchronized to the oscillation to greatly reduce noise contribution.

Although in FIG. 2, it is shown that the crystal 220 is positioned between the gate node NG and the ground node, it should be understood that positioning the crystal 220 between the gate node NG and the power supply node VDD is equally feasible. This is because the power supply node VDD, being considered an "AC ground," functions equivalently to the ground node with respect to AC aspects. Likewise, positioning the shunt capacitor 243 between the source node NS and the power supply node VDD is functionally equivalent to positioning the shunt capacitor 243 between the source node NS and the ground node.

For each circuit comprising a plurality of MOS transistors, there exists a complementary counterpart circuit, wherein each NMOS transistor is replaced by a PMOS transistor, each PMOS transistor is replaced by an NMOS transistor, and a power supply node and a ground node are interchanged. The complementary counterpart circuit performs the same function as the original circuit. Therefore, in the appended claims, "MOS transistor of a first conductivity type" and "MOS transistor of a second conductivity type" are stated; in a first embodiment, they refer to PMOS transistor and NMOS transistor, respectively; and in a second embodiment, they refer to NMOS transistor and PMOS transistor, respectively. Likewise, "a first DC node" and "a second DC node" are stated; in the first embodiment, they refer to the power supply node and the ground node, respectively; in the second embodiment, they refer to the ground node and the power supply node, respectively.

As shown in FIG. 3, a method for generating an oscillation signal in accordance with an embodiment of the present disclosure comprises: (step 310) employing a first MOS (metal-oxide-semiconductor) transistor of a first conductivity type, configured as a source follower, in accordance with a bias current established by a MOS transistor of a second conductivity type; (step 320) coupling a bias node to a gate terminal of the first MOS transistor of the first conductivity type using a DC (direct current) coupling network; (step 330) incorporating a feedback capacitor between the gate terminal and a source terminal of the first MOS transistor of the first conductivity type; (step 340) incorporating a shunt capacitor between the source terminal of the first MOS transistor of the first conductivity type and a DC node; (step 350) coupling a crystal to the gate terminal; and (step 360) injecting a feedback current into the source terminal in accordance with a voltage at a drain terminal of the first MOS transistor of the first conductivity type.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A crystal a crystal oscillator comprising:
   a first MOS (metal-oxide semiconductor) transistor of a first conductivity type having its gate, source, and drain terminals connected to a gate node, a source node, and a drain node, respectively;
   a DC (direct current) coupling network configured to couple the gate node to a first bias node;
   a MOS transistor of a second conductivity type having its gate, source, and drain terminals connected to a second bias node, a second DC node, and the drain node, respectively;
   a second MOS transistor of the first conductivity type having its gate, source, and drain terminals connected to the drain node, a first DC node, and the source node, respectively;
   a feedback capacitor positioned between the source node and the gate node;
   a shunt capacitor positioned between the source node and one of the first DC node and the second DC node; and
   a crystal positioned between the gate node and one of the first DC node and the second DC node.

2. The crystal oscillator of claim 1, wherein the first MOS transistor of the first conductivity type is a PMOS (p-channel metal oxide semiconductor) transistor, the MOS transistor of the second conductivity type is an NMOS (n-channel metal oxide semiconductor) transistor, the first DC node is a power supply node, and the second DC node is a ground node.

3. The crystal oscillator of claim 1, wherein the first MOS transistor of the first conductivity type is a NMOS (p-channel metal oxide semiconductor) transistor, the MOS transistor of the second conductivity type is a PMOS (p-channel metal oxide semiconductor) transistor, the first DC node is a ground node, and the second DC node is a power supply node.

4. The crystal oscillator of claim 1, wherein the first bias node has low impedance.

5. The crystal oscillator of claim 2, wherein the DC coupling network comprises a resistor.

6. The crystal oscillator of claim 3, wherein the DC coupling network is substantially non-conductive when a first gate voltage is below a certain voltage level.

7. The crystal oscillator of claim 6, wherein the DC coupling network further comprises a diode-connected MOS (metal-oxide semiconductor) transistor and the certain voltage level is determined by a threshold voltage of the diode-connected MOS transistor.

8. A method for generating an oscillation signal comprising:

employing a first MOS (metal-oxide-semiconductor) transistor of a first conductivity type, configured as a source follower, in accordance with a bias current established by a MOS transistor of a second conductivity type;

coupling a bias node to a gate terminal of the first MOS transistor of the first conductivity type using a DC (direct current) coupling network;

incorporating a feedback capacitor between the gate terminal and a source terminal of the first MOS transistor of the first conductivity type;

incorporating a shunt capacitor between the source terminal of the first MOS transistor of the first conductivity type and a DC node;

coupling a crystal to the gate terminal; and injecting a feedback current into the source terminal in accordance with a voltage at a drain terminal of the first MOS transistor of the first conductivity type.

9. The method of claim 8, wherein the first MOS transistor of the first conductivity type is a PMOS (p-channel metal oxide semiconductor) transistor, and the MOS transistor of the second conductivity type is a NMOS (n-channel metal oxide semiconductor) transistor.

10. The method of claim 8, wherein the first MOS transistor of the first conductivity type is a NMOS (n-channel metal oxide semiconductor) transistor, and the MOS transistor of the second conductivity type is a PMOS (p-channel metal oxide semiconductor) transistor.

11. The method of claim 8, wherein the DC node is one of a power supply node and a ground node.

12. The method of claim 8, wherein the bias node has low impedance.

13. The method of claim 12, wherein the DC coupling network comprises a resistor.

14. The method of claim 12, wherein the DC coupling network is substantially non-conductive when a gate voltage at the gate terminal is below a certain voltage level.

15. The method of claim 8, wherein injecting the feedback current into the source terminal in accordance with the voltage at the drain terminal of the first MOS transistor of the first conductivity type comprises using a second MOS transistor of the first conductivity type having its gate terminal connected to the drain terminal of the first MOS transistor of the first type, its drain terminal connected to the source terminal of the first MOS transistor of the first type, and its source terminal connected to a DC node.

\* \* \* \* \*